(12) United States Patent
Polyak et al.

(10) Patent No.: US 10,954,596 B2
(45) Date of Patent: Mar. 23, 2021

(54) TEMPORAL ATOMIC LAYER DEPOSITION PROCESS CHAMBER

(71) Applicant: Applied Materials, Inc., Santa Clara, CA (US)

(72) Inventors: Alexander S. Polyak, Palm Coast, FL (US); Joseph Yudovsky, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/467,817

(22) PCT Filed: Dec. 5, 2017

(86) PCT No.: PCT/US2017/064598
§ 371 (c)(1),
(2) Date: Jun. 7, 2019

(87) PCT Pub. No.: WO2018/106627
PCT Pub. Date: Jun. 14, 2018

(65) Prior Publication Data
US 2020/0032396 A1    Jan. 30, 2020

Related U.S. Application Data

(60) Provisional application No. 62/431,813, filed on Dec. 8, 2016.

(51) Int. Cl.
*C23C 16/40* (2006.01)
*C23C 16/455* (2006.01)

(52) U.S. Cl.
CPC .. *C23C 16/45574* (2013.01); *C23C 16/45544* (2013.01); *C23C 16/45565* (2013.01)

(58) Field of Classification Search
CPC ........ C23C 16/45574; C23C 16/45544; C23C 16/45565; H01L 21/67109
(Continued)

(56) References Cited

U.S. PATENT DOCUMENTS 6,245,192 B1 * 6/2001 Dhindsa ................ C23C 16/455
156/345.34
6,432,831 B2 * 8/2002 Dhindsa ................ C23C 16/455
438/710
(Continued)

FOREIGN PATENT DOCUMENTS

KR    100806983 B1    2/2008
WO    2011044451 A2   4/2011

OTHER PUBLICATIONS

PCT International Preliminary Report on Patentability in PCT/US2017/064598 dated Jun. 11, 2019, 11 pages.
(Continued)

*Primary Examiner* — Rudy Zervigon
(74) *Attorney, Agent, or Firm* — Servilla Whitney LLC

(57) ABSTRACT

A dual channel showerhead comprising a first plurality of channels formed in the back surface of the showerhead and extending from a first end to a second end, a second plurality of channels formed through the thickness of the showerhead and extending from a first end to a second end, a first end plenum in fluid connection with the second plurality of channels at the first end and a second end plenum in fluid connection with the second plurality of channels at the second end. Processing chambers including the dual channel showerhead and a blocker ring separating the edge ring from the pumping ring are also discussed.

19 Claims, 8 Drawing Sheets

(58) Field of Classification Search
USPC .................. 118/715; 156/345.33, 345.34
See application file for complete search history.

(56) References Cited

U.S. PATENT DOCUMENTS

| | | | | |
|---|---|---|---|---|
| 7,252,716 | B2* | 8/2007 | Kim ................... | C23C 16/4558 |
| | | | | 118/715 |
| 7,537,662 | B2* | 5/2009 | Soininen ............. | C23C 16/4412 |
| | | | | 118/715 |
| 7,601,223 | B2* | 10/2009 | Lindfors ............. | C23C 16/4412 |
| | | | | 118/715 |
| 7,674,352 | B2* | 3/2010 | Bour ................. | C23C 16/45572 |
| | | | | 156/345.34 |
| 7,976,631 | B2* | 7/2011 | Burrows ........... | C23C 16/45578 |
| | | | | 118/715 |
| 8,277,888 | B2* | 10/2012 | Dedontney ....... | C23C 16/45565 |
| | | | | 427/248.1 |
| 8,293,013 | B2* | 10/2012 | DeDontney ....... | C23C 16/45578 |
| | | | | 118/715 |
| 8,402,845 | B2* | 3/2013 | Dedontney ......... | B01J 19/0046 |
| | | | | 73/865.9 |
| 8,733,280 | B2* | 5/2014 | Yap .................. | C23C 16/45572 |
| | | | | 118/723 E |
| 8,764,902 | B2* | 7/2014 | Suzuki ............. | C23C 16/45574 |
| | | | | 118/715 |
| 9,057,128 | B2* | 6/2015 | Olgado ............. | C23C 16/45565 |
| 9,132,436 | B2* | 9/2015 | Liang ................. | C23C 16/455 |
| 9,269,564 | B2* | 2/2016 | Han .................. | C23C 16/45563 |
| 9,905,400 | B2* | 2/2018 | Stowell ............. | H01J 37/32192 |
| 9,978,564 | B2* | 5/2018 | Liang ................. | C23C 16/45561 |
| 10,354,843 | B2* | 7/2019 | Liang ................. | C23C 16/45561 |
| 10,541,145 | B2* | 1/2020 | Ogawa ............. | H01L 21/31116 |
| 10,604,841 | B2* | 3/2020 | Batzer ............... | H01J 37/32357 |
| 10,615,007 | B2* | 4/2020 | Stowell ............. | H01J 37/32119 |
| 10,622,189 | B2* | 4/2020 | Bravo ............... | H01J 37/32449 |
| 2001/0027026 | A1* | 10/2001 | Dhindsa ............ | C23C 16/45572 |
| | | | | 438/712 |
| 2002/0179248 | A1 | 12/2002 | Kabansky | |
| 2006/0021703 | A1 | 2/2006 | Umotoy et al. | |
| 2007/0266945 | A1* | 11/2007 | Shuto ................ | H01J 37/32091 |
| | | | | 118/723 E |
| 2008/0124463 | A1* | 5/2008 | Bour ................. | C23C 16/45574 |
| | | | | 427/255.28 |
| 2010/0167551 | A1* | 7/2010 | DeDontney ....... | C23C 16/45578 |
| | | | | 438/758 |
| 2010/0300359 | A1* | 12/2010 | Armour ............. | C23C 16/45572 |
| | | | | 118/724 |
| 2011/0039402 | A1* | 2/2011 | Yamazaki ......... | H01J 37/32449 |
| | | | | 438/488 |
| 2011/0180233 | A1* | 7/2011 | Bera ................. | H01L 21/67109 |
| | | | | 165/47 |
| 2012/0156877 | A1* | 6/2012 | Yap ................... | C23C 16/45572 |
| | | | | 438/689 |
| 2014/0027060 | A1* | 1/2014 | Ranish .............. | G01J 5/0818 |
| | | | | 156/345.33 |
| 2014/0174362 | A1* | 6/2014 | Kao .................. | C23C 16/45536 |
| | | | | 118/723 R |
| 2014/0235069 | A1* | 8/2014 | Breiling ............. | C23C 16/452 |
| | | | | 438/778 |
| 2015/0368799 | A1* | 12/2015 | Jiang ................. | C23C 16/45574 |
| | | | | 427/255.28 |
| 2018/0163305 | A1* | 6/2018 | Batzer ............... | H01J 37/3244 |
| 2019/0323126 | A1* | 10/2019 | Sung ................. | C23C 16/45565 |
| 2019/0382896 | A1* | 12/2019 | Doering ............. | C23C 16/4401 |
| 2020/0032396 | A1* | 1/2020 | Polyak .............. | C23C 16/45544 |

OTHER PUBLICATIONS

PCT International Search Report and Written Opinion in PCT/US2017/064598 dated Mar. 26, 2018, 14 pages.

* cited by examiner

TEMPORAL ATOMIC LAYER DEPOSITION PROCESS CHAMBER

CROSS-REFERENCE TO RELATED APPLICATIONS

This application is the National Stage entry of PCT/US2017/064598, filed on Dec. 5, 2017, which claims priority to U.S. Provisional Ser. No. 62/431,813, filed on Dec. 8, 2016, the entire disclosures of which are hereby incorporated herein.

TECHNICAL FIELD

The present disclosure relates generally to atomic layer deposition (ALD) processing chambers. In particular, the disclosure relates to temporal ALD processing chambers with reduced purge times.

BACKGROUND

Semiconductor device formation is commonly conducted in substrate processing systems or platforms containing multiple chambers, which may also be referred to as cluster tools. In some instances, the purpose of a multi-chamber processing platform or cluster tool is to perform two or more processes on a substrate sequentially in a controlled environment. In other instances, however, a multiple chamber processing platform may only perform a single processing step on substrates. The additional chambers can be employed to maximize the rate at which substrates are processed. In the latter case, the process performed on substrates is typically a batch process, wherein a relatively large number of substrates, e.g. 25 or 50, are processed in a given chamber simultaneously. Batch processing is especially beneficial for processes that are too time-consuming to be performed on individual substrates in an economically viable manner, such as for atomic layer deposition (ALD) processes and some chemical vapor deposition (CVD) processes.

Temporal ALD processes are sensitive to the time taken to replace one precursor with another during the deposition process. Showerhead and process area internal volumes have to be minimized and conductances maximized. Current design approaches to address precursor replacement and purge/vacuum issues in the ALD chamber include cross-flow, coaxial injection/vacuuming and spiral showerhead structures. However, there is an ongoing need in the art for apparatus and methods to further reduce the amount of time between reactive gas exposures due to process chamber purging.

SUMMARY

One or more embodiments of the disclosure are directed to dual channel showerheads comprising a back surface and a front surface defining a thickness of the showerhead. A first plurality of channels is formed in the back surface of the showerhead. The first plurality of channels extends from a first end to a second end. A second plurality of channels is formed through the thickness of the showerhead. The second plurality of channels extends from a first end to a second end. A first end plenum is formed in the back surface and is in fluid communication with the second plurality of channels at the first end. A second end plenum is formed in the back surface and is in fluid communication with the second plurality of channels at the second end.

Additional embodiments of the disclosure are directed to dual channel showerheads comprising a back surface and a front surface defining a thickness of the showerhead. A first plurality of channels is formed in the back surface of the showerhead. The first plurality of channels extends from a first end to a second end. The first plurality of channels has a square cross-section with a cross-sectional area that increases from the first end to the second end. The first plurality of channels including a plurality of holes extending to the front surface. A second plurality of channels is formed through the thickness of the showerhead. The second plurality of channels extends from a first end to a second end and has a round cross-section with a cross-sectional area that increases from the first end to the second end. Each of the second plurality of channels includes a plurality of holes extending to the front surface. A first end plenum is formed in the back surface and is in fluid communication with the second plurality of channels at the first end. A second end plenum is formed in the back surface and is in fluid communication with the second plurality of channels at the second end. A plurality of holes spaced around the periphery of the showerhead extends through the showerhead.

Some embodiments of the disclosure are directed to dual channel showerheads comprising a back surface and a front surface defining a thickness of the showerhead. A plurality of ridges is formed on the back surface of the showerhead. The plurality of ridges defines a first plurality of channels on the back surface of the showerhead. The first plurality of channels extends from a first end to a second end. A second plurality of channels is formed through the thickness of the showerhead. The second plurality of channels extends from a first end to a second end. A recess in the back surface of the showerhead forms a plenum. The plenum surrounds the plurality of ridges and forms a fluid connection with the second plurality of channels at one or more of the first end and the second end.

Further embodiments of the disclosure are directed to processing chambers comprising a chamber body enclosing an interior. A pedestal is within the interior to support a wafer during processing. An edge ring is around the pedestal. A pumping ring is around the edge ring. The pumping ring is spaced from the edge ring to form a gap. A blocker ring spans the gap between the edge ring and the pumping ring. The blocker ring isolates a process gap above the pedestal from the interior of the chamber body below the pedestal. A dual channel showerhead is positioned above the pedestal. The showerhead has a front face spaced from the pedestal to form the process gap.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
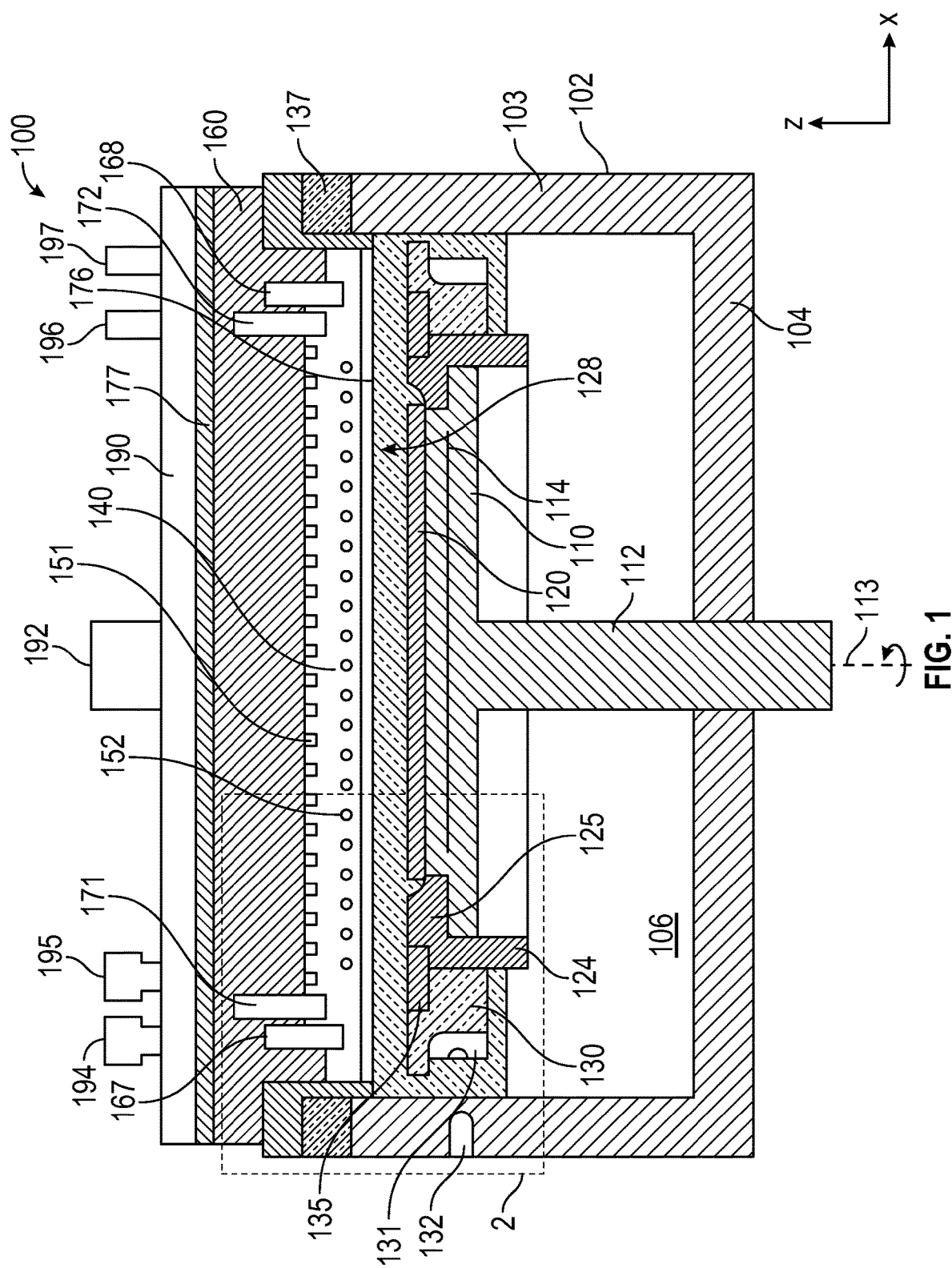
FIG. 1 shows a cross-sectional schematic view of a processing chamber in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Some embodiments of the disclosure advantageously provide apparatus to reduction the length of time for a showerhead purge. Some embodiments advantageously provide apparatus to reduce the volume of the process zone. One or more embodiments advantageously reduce the length of time for showerhead purging and reduce the volume of the process zone.

In some embodiments, the showerhead contains two systems of parallel channels for precursor delivery (referred to as zones). The channels may be designed in such a way as to allow for two independent and isolated volumes each dedicated to a certain precursor. The parallel structure of some embodiments maximizes conductance, while small height of each zone minimizes volume. One or both zones may contain one or more gas inlet and one or more vacuum exhaust.

In some embodiments, a peripheral vacuum manifold enables faster evacuation of the process volume above the wafer. In some embodiments, the showerhead positioned in the chamber lid is aided by close proximity precursor isolation valves, purge and vacuum valves and pressurized storage/vacuum reservoirs. The process cavity may contain process and fast exhaust vacuum manifolds and a floating isolation ring that seals or nearly seals the process volume at the process gap and allows for downward stroke of the pedestal for wafer exchange.

Figure 2:
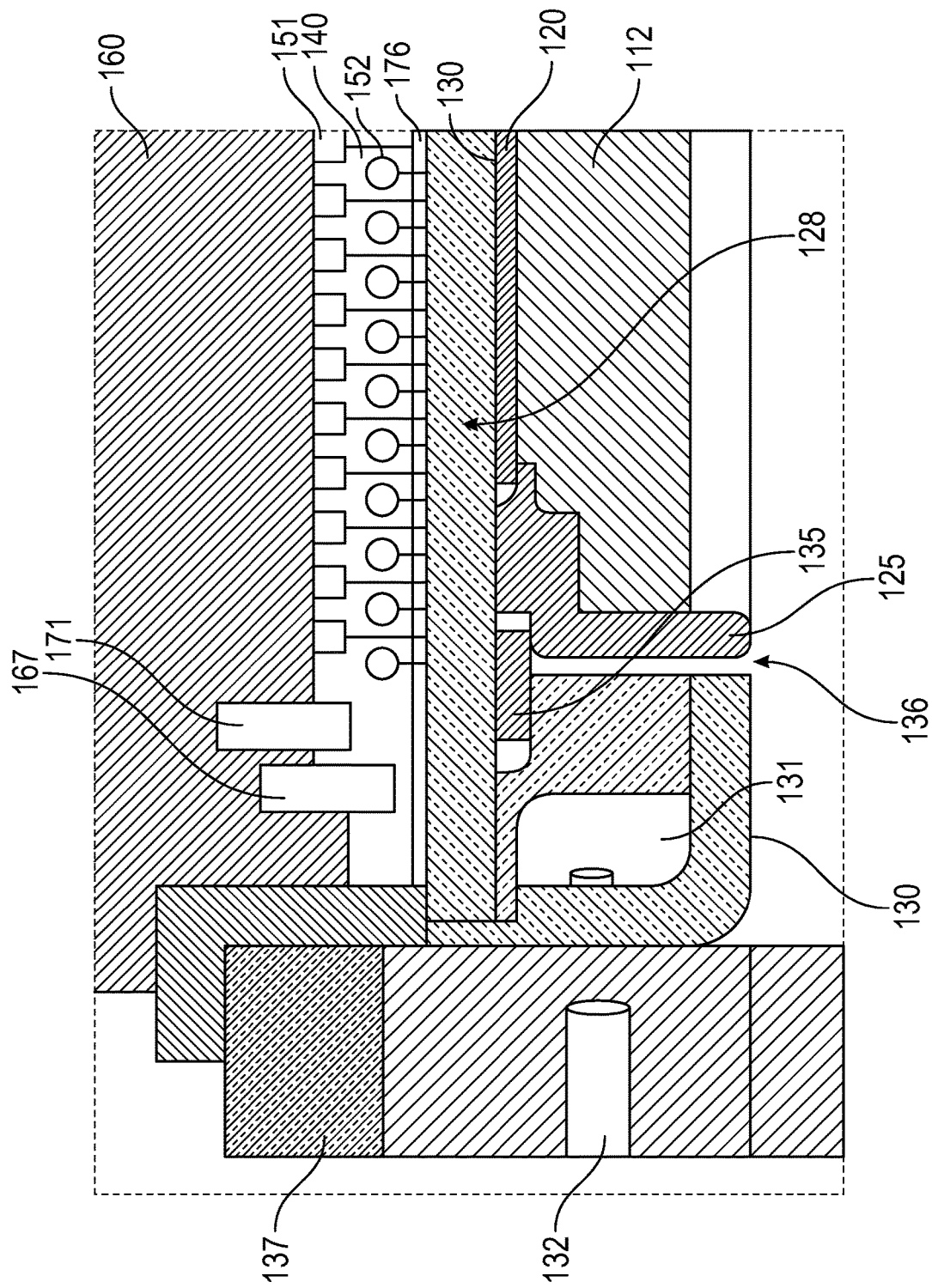
FIG. 2 shows an expanded cross-sectional schematic view of a region 2 of the processing chamber of FIG. 1.

Referring to FIGS. 1 and 2, a processing chamber 100 in accordance with one or more embodiment of the disclosure is illustrated. FIG. 1 shows a schematic cross-sectional view of a processing chamber 100 and FIG. 2 shows an expanded view of region 2 of the processing chamber 100. The line hatching is used to facilitate differentiation of components and should not be taken as being indicative of material of construction.

The processing chamber 100 includes a chamber body 102 with a sidewall 103 and bottom wall 104. A pedestal 110 is located within the interior 106 of the processing chamber 100. The pedestal 110 is connected to a shaft 112 that can move in the z axis and rotate around a central axis 113. The pedestal 110 and shaft 112 can be integral component or can be separate components connected together. In some embodiments, the pedestal 110 includes a heater 114 or cooler (not shown), or combination heater/cooler to control the temperature of a wafer 120 supported on the top surface of the pedestal 110. A vacuum source (not shown) can be connected to the chamber body 102 to maintain a vacuum in the interior 106 of the processing chamber 100. A chamber lid 137 is on top of the sidewall 103.

An edge ring 124 is positioned to surround the pedestal 112 and support the wafer 120. The edge ring 124 is a generally ring-shaped or generally cylindrical component with a lip region 125 sized to support a wafer 120. The lip region 125 can extend over a portion of the pedestal 112 and rest on the pedestal 112 during processing. For example, when lifting the wafer 120, the edge ring 124 is located so that the lip region 125 does not rest on the pedestal 112. This can be done by either lowering the pedestal 112 or raising the edge ring 124. When in the processing position (i.e., when the wafer 120 is on the pedestal 112) the lip region 125 can rest on the pedestal 112 and either touch or not touch the wafer 120. The thickness of the lip region 125 can be configured so that the wafer 120 does not contact the lift ring 125 during processing. The edge ring 124 can be made from any suitable material including, but not limited to, aluminum oxide, ceramic or a dielectric material.

A pumping ring 130 is positioned to surround the edge of the pedestal 112 and edge ring 124. The pumping ring 130 of some embodiments is slightly larger than the outer diameter of the edge ring 124 to allow sufficient room for movement of the edge ring 124 within the pumping ring 130. A plenum 131 may be located in a portion of the pumping ring 130 and connected to a vacuum source (not shown) through an opening 132 in the sidewall 102. The pumping ring 130 can be made from any suitable material including, but not limited to, ceramic materials.

A blocker ring 135 is positioned to seal the gap 136 (shown in FIG. 2) located between the edge ring 124 and the pumping ring 130. The gap 135 can cause disturbance in the gas flow within the process gap 128 and during purging of the process gap 128. The blocker ring 135 isolates the process gap 128 from the chamber interior 106 to increase the rate at which the process gap 128 can be purged. The blocker ring 135 can be made from any suitable material including, but not limited to, aluminum oxide, ceramic or a dielectric material.

The process gap 128 and the chamber interior 106 are exhausted through different outlets. The process gap 128 and the chamber interior 106 are pumped out (i.e., exhausted) at the same time. The combined pumping contributes to the disturbances in the gas flow from the process gap 128. The blocker ring 135 bridges the gap between the edge ring 124 and the pumping ring 130 so that the combined exhaust does not cause any disturbance in the gas flow.

The blocker ring 135 can be a stand-alone component which is positioned with the wafer or can be connected to one of the edge ring 124 or the pumping ring 130. In some embodiments, the blocker ring 135 is independently movable and can be positioned to bridge the edge ring 124 and pumping ring 130 after the wafer 120 has been positioned on the edge ring 124.

A showerhead 140 forms the upper bound of the process gap 128 so that the process gap 128 is defined by the pedestal 112/wafer 120 surface on the bottom and the pumping ring 130 around the periphery. The showerhead 140 can be supported by the chamber lid 137 or can be considered a portion of the chamber lid assembly which includes components that are connected directly to the chamber lid.

Figure 3:
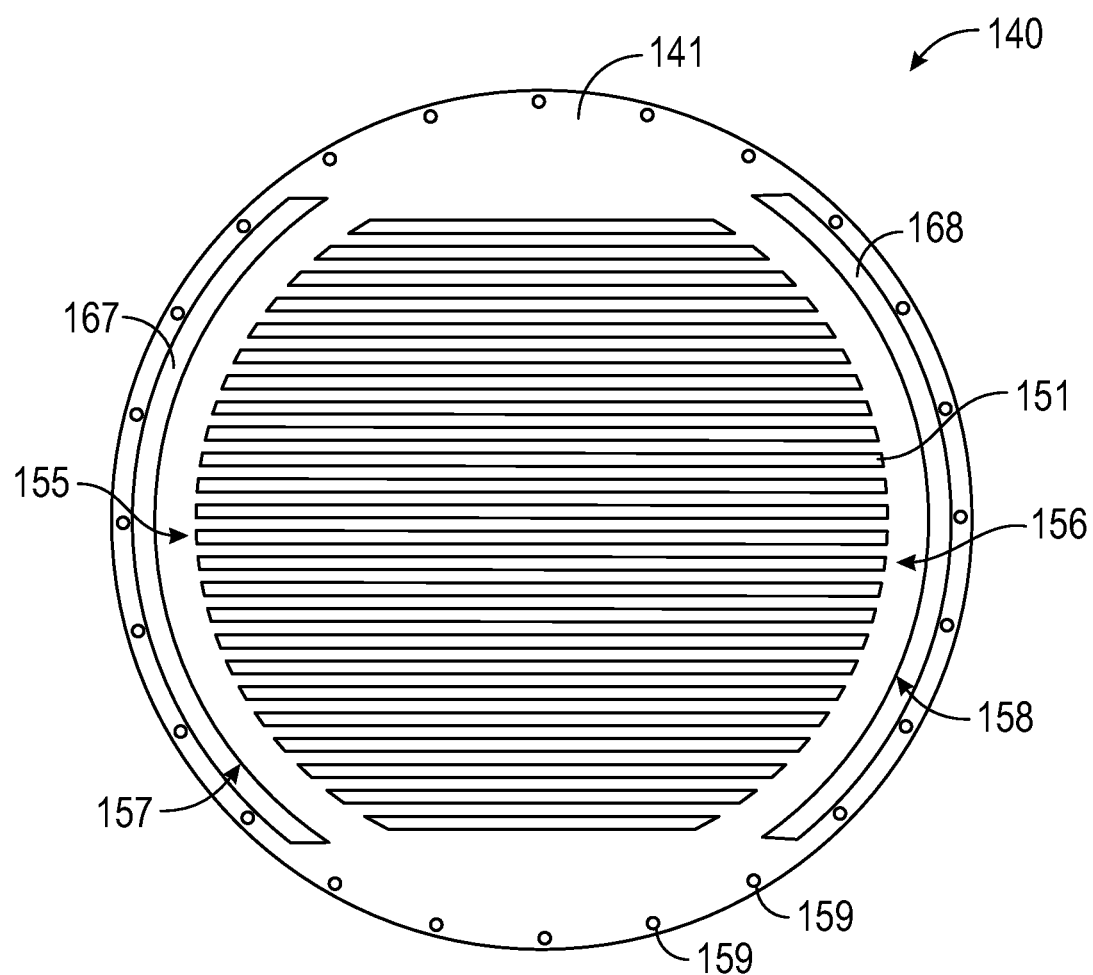
FIG. 3 shows a back view of a showerhead in accordance with one or more embodiment of the disclosure.
Figure 4:
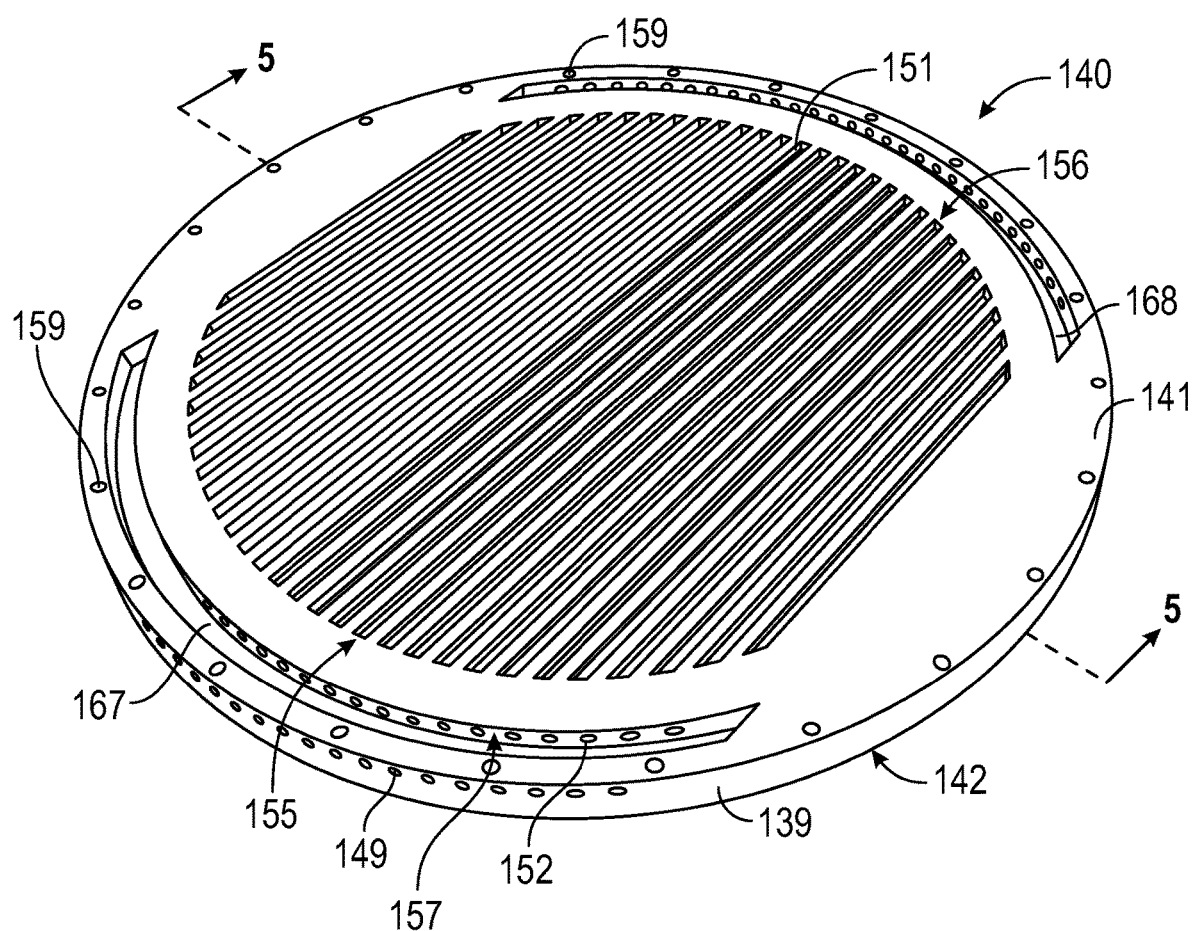
FIG. 4 shows a perspective view of a showerhead in accordance with one or more embodiment of the disclosure.
Figure 5:
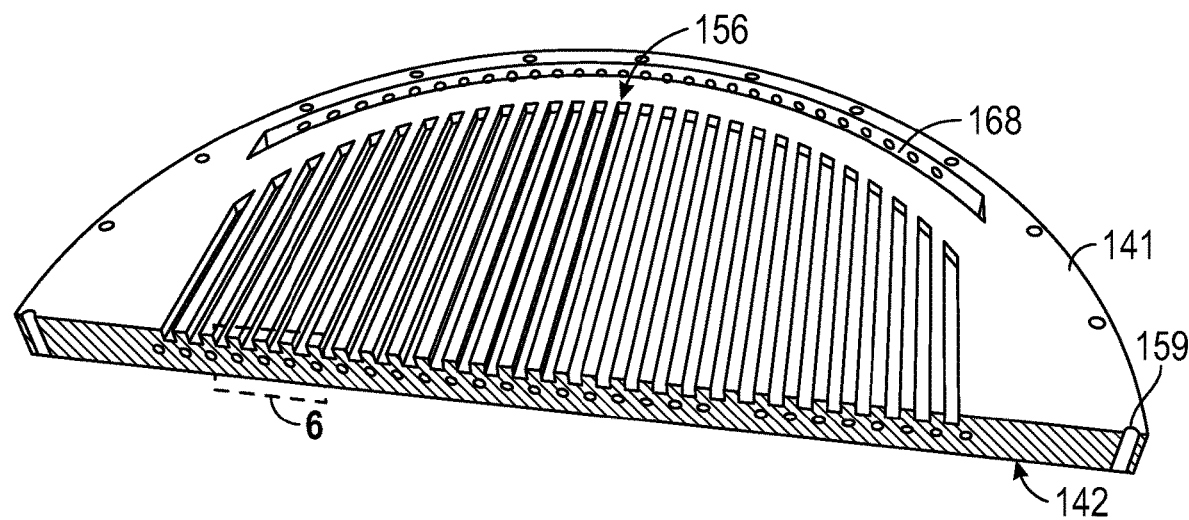
FIG. 5 shows a cross-sectional view of the showerhead of FIG. 4 taken along line 5-5.
Figure 6:
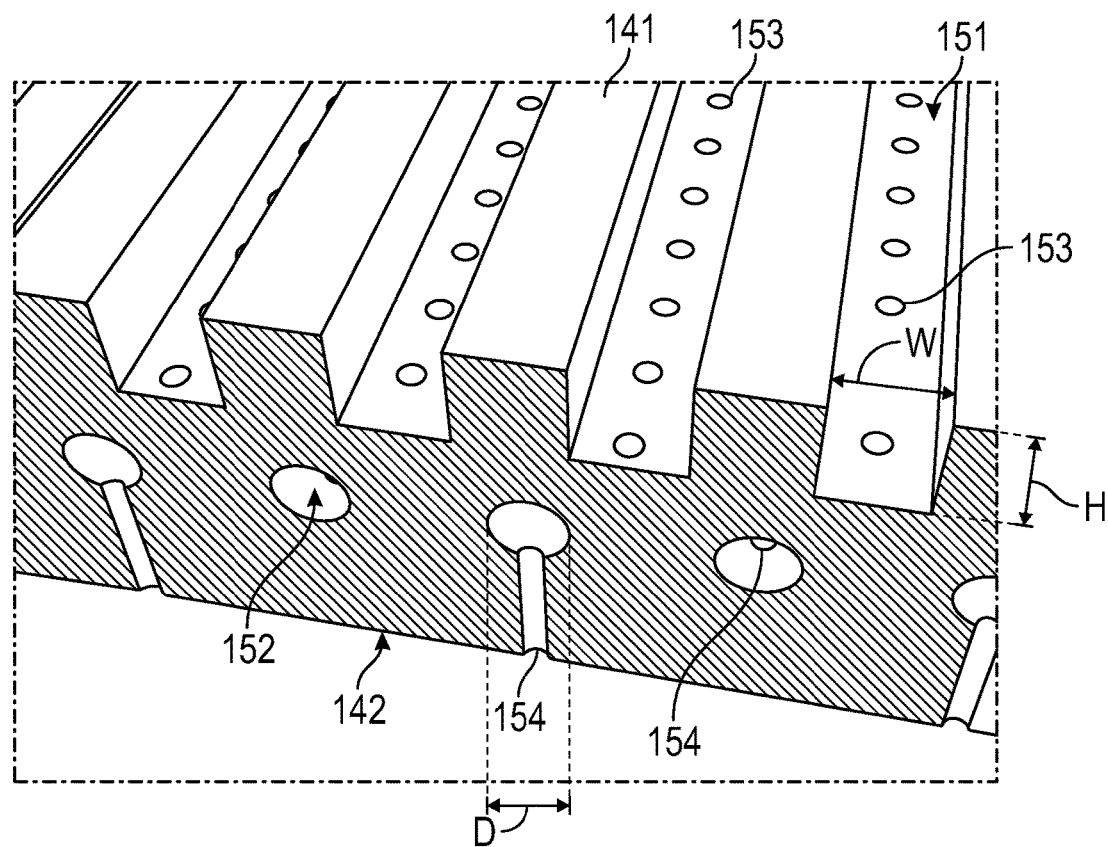
FIG. 6 shows an expanded view of region 6 from FIG. 5.

FIGS. 3 through 6 shows a showerhead 140 in accordance with one or more embodiment of the disclosure. FIG. 3 shows a top view of the showerhead 140 and FIG. 4 shows a perspective view of the showerhead of FIG. 3. FIG. 5 shows a cross-sectional view of the showerhead 140 taken along line 5-5. FIG. 6 shows an expanded view of region 6 from FIG. 5.

The showerhead 140 has a back surface 141 and a front surface 142 that defines a thickness of the showerhead 140. FIGS. 3 through 6 show a view of the back surface 141 of the showerhead 140. The showerhead 140 includes a first plurality of channels 151 and a second plurality of channels 152. The first plurality of channels 151 can be configured to deliver a reactive gas to the process gap 128. The second plurality of channels 152 can be configured to deliver a different reactive gas to the process gap 128.

The embodiment shown in the figures has the first plurality of channels 151 and the second plurality of channels 152 extending along the same direction. This is merely representative of one possible configuration and should not be taken as limiting the scope of the disclosure. In some embodiments, the second plurality of channels 152 extend in a direction parallel to or transverse to the first plurality of channels 151.

The first plurality of channels 151 are illustrated as trenches formed in the back surface 141 of the showerhead 140. A backing plate 160 (see FIG. 7) can be positioned against the back surface 141 of the showerhead 140 to enclose the trenches. A gas flowing through the first plurality of channels 151 might enter the channels 151 at a first end 155 and exiting the channels 151 at a second end 156.

Figure 8A:
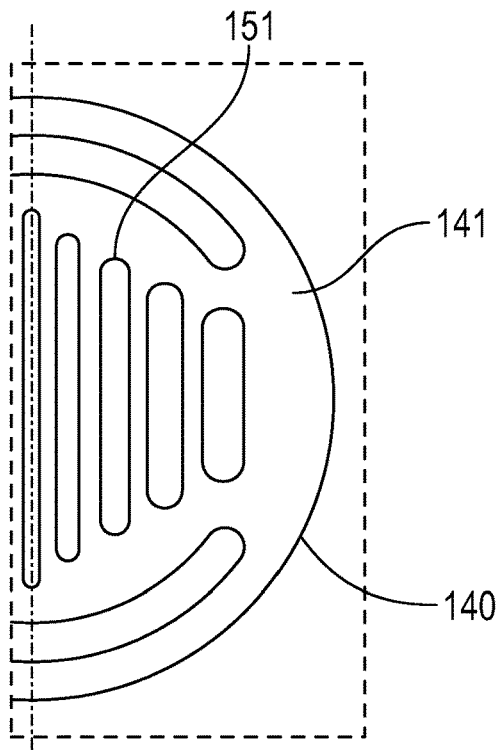
FIGS. 8A and 8B show partial schematic view of channels in a showerhead in accordance with one or more embodiment of the disclosure.

The channels 151 extend generally parallel to each other. In some embodiments, the elongate axis of an individual channel extends parallel to the elongate axis of an adjacent channel. The elongate axis is the axis formed between the first end 155 and the second end 156 of the channel 151. The shape and size of the individual channels 151 can be changed to control the conductance of the gases flowing through the individual channels 151. For example, the individual channels on the ends of the plurality of channels 151 are shorter in length than the individual channels in the middle of the plurality of channels 151. If the height and width of each of the channels are equal, channels with shorter lengths might have a different conductance than channels with longer lengths. FIG. 8A shows an exaggerated embodiment in which the outer channels are wider than the inner channel.

Figure 8B:
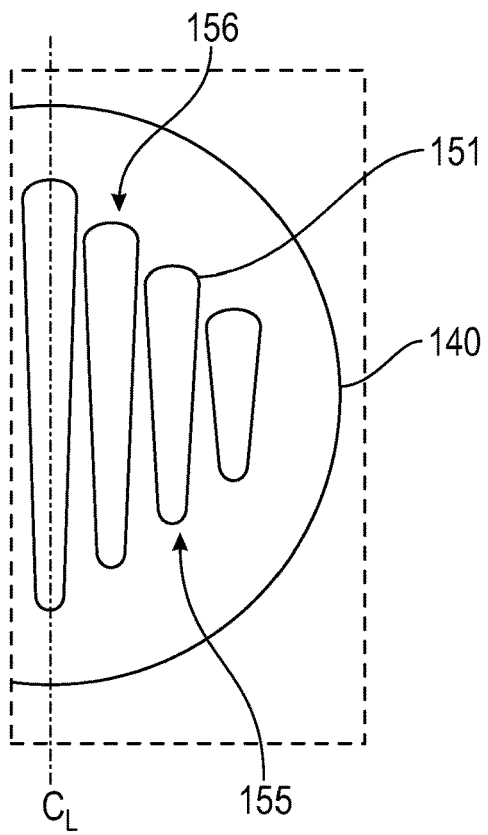

The shape of the channels 151 along the length of the channels might change to affect the conductance of gases. For example, FIG. 8B shows an exaggerated embodiment in which the width of the channels at the first end 155 is smaller than the width of the channels at the second end 156.

The cross-sectional shape of the channels 151, as shown in FIG. 6, is generally rectangular or square. However, those skilled in the art will understand that the shape can be changed to suit manufacturing techniques and gas conductance. In some embodiments, any or all of the first plurality of channels 151 have rounded bottoms.

In some embodiments, the first plurality of channels 151 are generally square shaped in cross-section. The width W of the channels 151 can be in the range of about 2 mm to about 20 mm, or in the range of about 3 mm to about 15 mm, or in the range of about 4 mm to about 10 mm, or in the range of about 4 mm to about 8 mm, or in the range of about 4 mm to about 6 mm. In some embodiments, the width W of the channels 151 are about 5 mm. The height H of the channels 151 can be in the range of about 2 mm to about 20 mm, or in the range of about 3 mm to about 15 mm, or in the range of about 4 mm to about 10 mm, or in the range of about 4 mm to about 8 mm, or in the range of about 4 mm to about 6 mm. In some embodiments, the height H of the channels 151 is about 5 mm. In some embodiments, the width W and height H of the channels 151 are in the range of about 4 mm to about 6 mm. In one or more embodiments, the width W and the height H of the channels 151 are about 5 mm.

The distance between the centers of the channels 151, referred to as the pitch, is in the range of about 3 mm to about 30 mm, or in the range of about 5 mm to about 20 mm, or in the range of about 8 mm to about 12 mm. In some embodiments, the pitch of the channels 151 is about 10 mm. In some embodiments, the pitch of the channels 151 changes so that the channels on the inner portion of the plurality of channels are closer together or further apart than the channels on the outer portion of the plurality of channels 151.

A plurality of holes 153 (see FIG. 6) extend from the individual channels 151 to the front surface 142 of the showerhead 140. The diameter of the holes 153 are in the range of about 0.3 mm to about 1 mm, or in the range of about 0.4 mm to about 0.8 mm, or about 0.5 mm.

The spacing between the holes 153 along the length of the channel 151 can be equal or varied. The conductance of the gases flowing through the channels and the holes to the process gap can be affected by the pitch of the holes 153. In some embodiments, the holes 153 are closer together near the second end 156 than near the first end 155. In some embodiments, the holes 153 are closer together near the center of the channels 151 than at either the first end 155 or second end 156.

The second plurality of channels 152 are illustrated as cylindrical holes in the thickness of the showerhead 140. The thickness of the showerhead 140 is also referred to as the body of the showerhead or the meat of the showerhead. The second plurality of channels 152 extend from a first end 157 to a second end 158. The second plurality of channels 152 are formed within the meat of the showerhead away from the back surface 141 and the front surface 142.

In some embodiments, the first end 157 of the channels 152 are in fluid communication with a first end plenum 167 formed in the back surface 141 of the showerhead 140. In some embodiments, the second end 158 of the channels 152 are in fluid communication with a second end plenum 168 formed in the back surface 141 of the showerhead 140. In the embodiment shown, the first end plenum 167 and second end plenum 168 are semicircular grooves formed in the showerhead that extend from a region on either side of the plurality of channels 152 so that the ends of the plenums are wider than the width of the channels.

The first end plenum 157 and second end plenum 158 can be used to equalize the conductance of gases through the second plurality of channels 152. In use, the first end plenum 157 has a volume larger than the channels 152 so that the plenum can fill with gas to a uniform distribution so that there is an equal pressure driving force to the first end of the channels 152. In some embodiments, the first end plenum 157 has a volume larger than about three, four or five times the combined volume of the second plurality of channels 152. The second end plenum 158 has a volume sufficient to provide a uniform driving force to gases exiting the channels 152.

The channels 152 extend generally parallel to each other. In some embodiments, the elongate axis of an individual channel extends parallel to the elongate axis of an adjacent channel. The elongate axis is the axis formed between the first end 157 and the second end 158 of the channel 152. The shape and size of the individual channels 152 can be changed to control the conductance of the gases flowing through the individual channels 152. For example, the individual channels on the ends of the plurality of channels 152 are shorter in length than the individual channels in the middle of the plurality of channels 152. If the height and width of each of the channels are the same, channels with shorter lengths might have a different conductance than channels with longer lengths. In some embodiments, the cross-sectional areas of the individual channels are different so that the outer channels are wider than the inner channels. This is similar to the embodiment illustrated in FIG. 8A except that the channels are within the body of the showerhead.

The shape of the channels 152 along the length of the channels might change to affect the conductance of gases. Similarly to that shown in FIG. 8B, the channels might have a wider cross-sectional area near the second end 158 than near the first end 157.

The cross-sectional shape of the channels 152, as shown in FIG. 6, is cylindrical. However, those skilled in the art will understand that the shape can be changed to suit manufacturing techniques and gas conductance. In some embodiments, the second plurality of channels 152 are generally circular shaped in cross-section, or cylindrical along the length. The diameter D of the channels 152 can be in the range of about 2 mm to about 20 mm, or in the range of about 3 mm to about 15 mm, or in the range of about 4 mm to about 10 mm, or in the range of about 4 mm to about 8 mm, or in the range of about 4 mm to about 6 mm. In some embodiments, the diameter D of the channels 152 is about 6 mm. The height H of the channels 151 can be in the range of about 2 mm to about 20 mm, or in the range of about 3 mm to about 15 mm, or in the range of about 4 mm to about 10 mm, or in the range of about 4 mm to about 8 mm, or in the range of about 5 mm to about 7 mm. In some embodiments, the diameter D of the channels 151 is about 6 mm. The cross-sectional diameters are measured as the average diameter along the length of the channel 152.

In some embodiments, the channels 152 are elongate oval shapes with a major axis and a minor axis. The average cross-sectional area is in the range of about 80 mm$^2$ to about 140 mm$^2$, or in the range of about 90 mm$^2$ to about 130 mm$^2$, or in the range of about 100 mm$^2$ to about 120 mm$^2$, or about 110 mm$^2$.

The distance between the centers of the channels 152, referred to as the pitch, is in the range of about 3 mm to about 30 mm, or in the range of about 5 mm to about 20 mm, or in the range of about 8 mm to about 12 mm. In some embodiments, the pitch of the channels 152 is about 10 mm. In some embodiments, the pitch of the channels 152 changes so that the channels on the inner portion of the plurality of channels are closer together or further apart than the channels on the outer portion of the plurality of channels 152.

A plurality of holes 154 (see FIG. 6) extend from the individual channels 152 to the front surface 142 of the showerhead 140. The diameter of the holes 154 are in the range of about 0.3 mm to about 1 mm, or in the range of about 0.4 mm to about 0.8 mm, or about 0.5 mm.

The spacing between the holes 154 along the length of the channel 152 can be equal or varied. The conductance of the gases flowing through the channels and the holes to the process gap can be affected by the pitch of the holes 154. In some embodiments, the holes 154 are closer together near the second end 158 than near the first end 157. In some embodiments, the holes 154 are closer together near the center of the channels 152 than at either the first end 157 or second end 158.

The front surface 142 of the showerhead 140 has a plurality of apertures aligned with the holes 153, 154 to allow reactive gases to flow from the channels 151, 152 to the process gap 128. The front view of the showerhead looks like a surface with a plurality of holes or openings. The arrangement of the holes or openings depends on the arrangement of apertures in the channels 151, 152.

The showerhead 140 can be made from any suitable material including, but not limited to, aluminum, stainless steel or aluminum alloys.

The second plurality of channels 152 can be drilled into the showerhead 140 from the side 139 of the showerhead 140. Referring to FIG. 4, the drilling procedure can form a hole through the side 139, passing through the first end plenum 167, through the meat of the showerhead and at least to the second end plenum 168. The holes in the side 139 of the showerhead can be closed with a plug 149 to prevent gases from flowing out the side 139 of the showerhead 140.

The showerhead 140 shown in the Figures includes a plurality of holes 159 around the periphery of the showerhead 140. The holes 159 can pass through the body of the showerhead 140 to allow a gas or vacuum connection to pass through the showerhead 140 without flowing through the channels 151, 152.

Referring back to FIGS. 1 and 2, the processing chamber 100 can include an inner insulating ring 176. The inner insulating ring 176 can be positioned between the showerhead 140 and pumping ring 130. The inner insulating ring 176 in some embodiments electrically isolates the showerhead 140 from the pumping ring 130. In some embodiments, the inner insulating ring 176 thermally insulates the showerhead 140 from the pumping ring 130. The inner insulating ring 176 can be made of any suitable material including, but not limited to, ceramic, aluminum oxide or a dielectric material.

Figure 7:
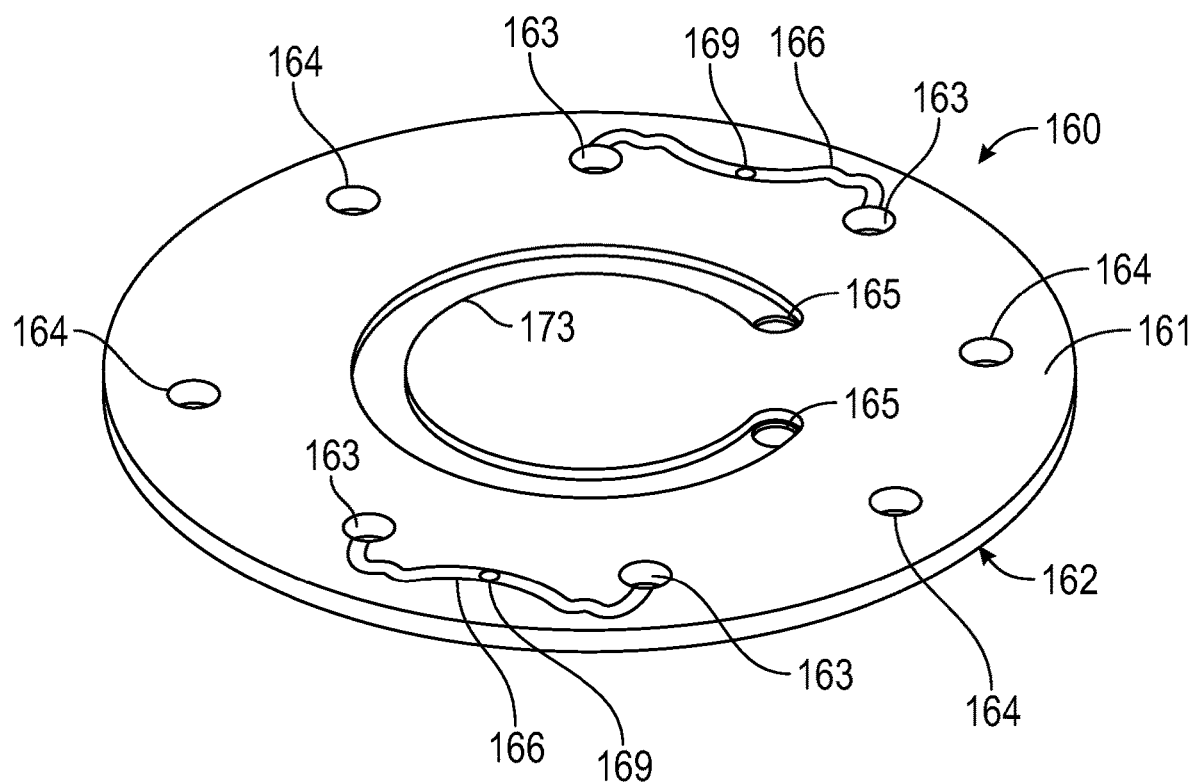
FIG. 7 shows a back perspective view of a backing plate in accordance with one or more embodiment of the disclosure.
Figure 7A:
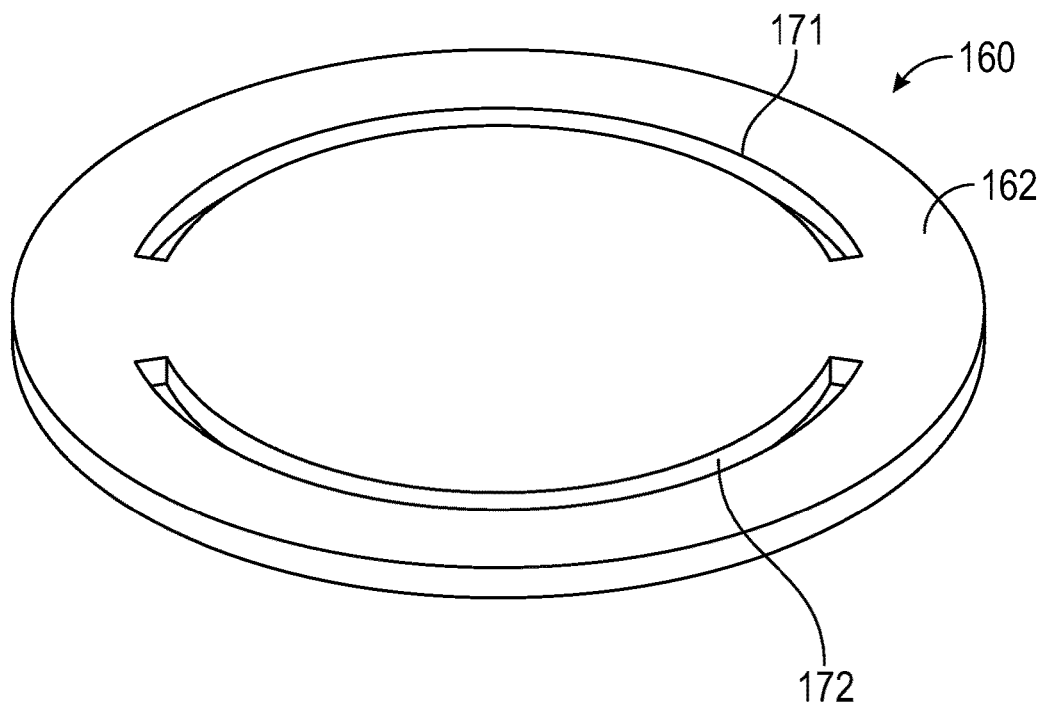
FIG. 7A shows a front perspective view of a backing plate in accordance with one or more embodiment of the disclosure.

Referring to FIGS. 7 and 7A, the backing plate 160 has a top surface 161 and a bottom surface 162. The bottom surface 162 is positioned adjacent the back surface 141 of the showerhead 140 and helps form the plurality of channels 151 in the showerhead 140.

The backing plate 160 can include one or more first openings 163, one or more second openings 164 and one or more third openings 165. The first openings 163 can form a fluid connection with the plurality of first channels 151 in the showerhead 140. The first openings 163 are shown with gas conduits 166 formed in the top surface 162 of the backing plate 160. A gas flowing through the center connector 169 passes through the gas conduits 166 to the first openings 163. The gas conduits 166 have equal conductance from the center connector 169 to the openings 163.

In the embodiment shown, the bottom surface 162 of the backing plate 160, as shown in FIG. 7A, has a first end plenum 171 and a second end plenum 172. The first end plenum 171 can be aligned with the first end 155 of the channels 151 and the second end plenum 172 can be aligned with the second end 156 of the channels 151.

In use, a gas would flow to the center connector 169 from a gas source; pass through the gas conduits 166 and the first openings 163 into the first plenum 171. The volume of the first plenum 171 is sufficiently large compared to the volume of the channels 151 to increase the pressure homogeneity in the first plenum 171. The gas flows from the first end plenum 171 through the first end 155 of the channels 151, through the channels 151 to the second end 156 and to the second end plenum 172. The second end plenum 172 can be connected to a vacuum source (not shown) so that the gases can be rapidly removed from the showerhead 140.

In some embodiments, gas flow into the channels 151 through both the first end 155 and the second end 156. In embodiments of this sort, both the first plenum 171 and the second plenum 172 are fed with the reactive gas and the reactive gas flows from both ends of the channels 151.

Referring again to FIG. 7, the second holes 164 can be aligned with the first end plenum 167 in the showerhead 140 and the second end plenum 168 in the showerhead 140. In use, a gas would flow through the second openings 164 to the first end plenum 167. From the first end plenum 167, the gas flows through the channels 152 to the second end plenum 168. To purge the channels 152, a vacuum source is connected to the second end plenum 168 and draws the gas in the channels 152 through the second openings 164 and out of the system.

In the embodiment shown, the third openings 165 are connected to a vacuum plenum 173 which is connected to a vacuum source (not shown). The vacuum plenum 173 and the third openings 165 can be in fluid communication with the holes 159 in the showerhead. The holes 159 in the showerhead 140 can form a fluid connection between the vacuum source (not shown) and the process gap 128 to increase the efficiency and/or speed that the process gap 128 can be purged of a reactive gas.

Referring again to FIGS. 1 and 2, the processing chamber 100 includes an outer insulating ring 177. The outer insulating ring 177 can be positioned between adjacent the top surface 161 the backing plate 160. The outer insulating ring 177 in some embodiments electrically isolates the showerhead backing plate 160 from components above the outer insulating ring 177. In some embodiments, the outer insulating ring 177 thermally insulates the backing plate 160. The outer insulating ring 177 can be made of any suitable material including, but not limited to, ceramic, aluminum oxide or a dielectric material A chamber lid plate 190 is positioned above the outer insulating ring 177. The chamber lid plate 190 can connect to chamber lid 137 through intervening components or can surround the intervening components to completely enclose the components. The chamber lid plate 190 can be made from any suitable material including, but not limited to, stainless steel, aluminum or an aluminum alloy.

A vacuum manifold 192 can be connected to the vacuum plenum 173 in the backing plate 160. Precursor delivery manifolds 194, 195 connect to the channels 151, 152 through the backing plate 160 and exhaust through ports 196, 197. The exhausts 196, 197 can be separate exhaust ports to prevent the reactive gases from mixing, or can be a single exhaust port.

In use, the process gap 128 can be rapidly evacuated by a combination of vacuum connected to opening 132 to the pumping ring 130 and through the showerhead 140. The flow of reactive gas in the channels 151, 152 are stopped and the vacuum is enabled drawing the gases through the second end of the channels 151, 152 to clear the channels and the process gap 128.

Figure 9:
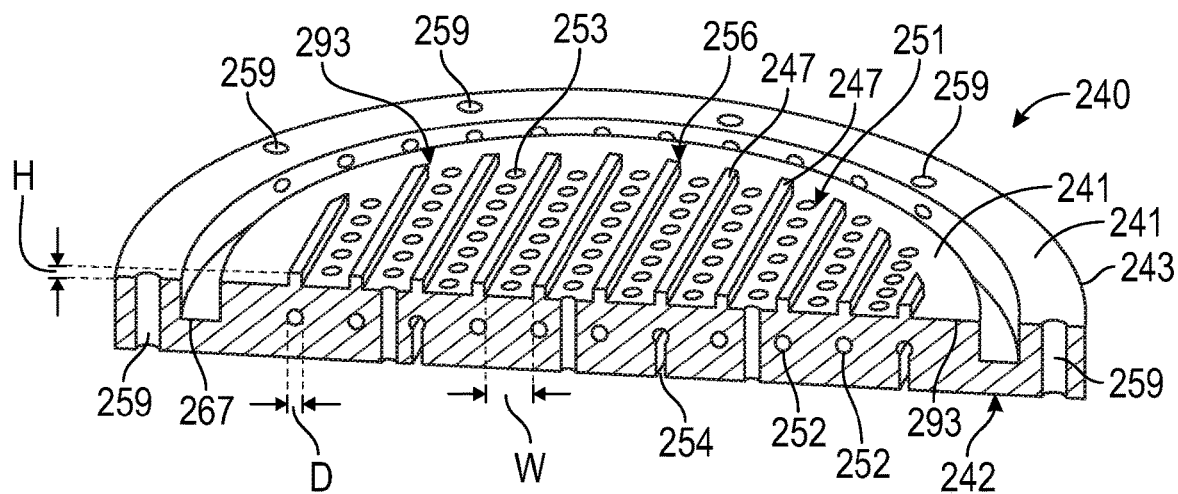
FIG. 9 shows a cross-sectional view of a showerhead in accordance with one or more embodiment of the disclosure.

FIG. 9 illustrates another embodiment of a showerhead 240 in accordance with one or more embodiment of the disclosure. The showerhead 240 is similar to that illustrated in FIGS. 5 and 6 with a circular plenum 267 and plurality of ridges 247 on the top surface 241 to form a plurality of channels 251.

The plenum 267 extends around the outer diameter region of the showerhead 240 and is spaced a distance from the peripheral edge 243. The distance that the plenum 267 is spaced from the peripheral edge 243 is greater than the diameter of the holes 259. The channels 252 extends from a first end (not shown) of the showerhead to a second end 256 of the showerhead 140 and connect to the plenum 267. The plenum 267 is in fluid communication with the channels 252 so that a gas within the plenum 267 can flow through channels 252 and out holes 254 in the front surface 242 of the showerhead 240. Each of the channels 252 can be in fluid communication with the plenum 267 at both the first end and the second end or at one of the first end or the second end. In some embodiments, every other channel 252 is in fluid communication with the plenum 267 at the first end and not in fluid communication with the plenum 267 at the second end, and channels in between every other channel is in fluid communication with the plenum 267 at the second end 256 and not the first end.

The top surface 241 has a plurality of ridges 247 formed thereon. The ridges extend along the same direction as the channels 252. In some embodiments, the ridges 247 are aligned with the channels 252 so that the ridges 247 are over the channels 247. In some embodiments, width W and height H of the ridges 247 can be the same as the width W and height H, respectively, of the channels 151 (illustrated in FIG. 6). The ridges 247 can be integrally formed with the showerhead 240, or can be separate components that are affixed (e.g., welded) to the top surface 241 of the showerhead 240.

The ridges 247 form sidewalls of channels 251. A plurality of holes 253 are spaced along the length of the channels 251 and extend to the bottom surface 242, as shown in FIG. 10.

The plenum 267 is a recess in the showerhead 240 that surrounds the plurality of ridges 247. As used in this manner, the term "surrounds" means that the plurality of ridges are within the bounds of the recess that forms the plenum 267. The ridges 267 do not extend into the plenum so that there is a region 293 between the plenum 267 and the ridges 247.

The region 293 provides a location for another component to contact the showerhead 240 to separate the channels forming a dual zone showerhead. The region 293 can include a recess (not shown) to support an o-ring.

Figure 10:
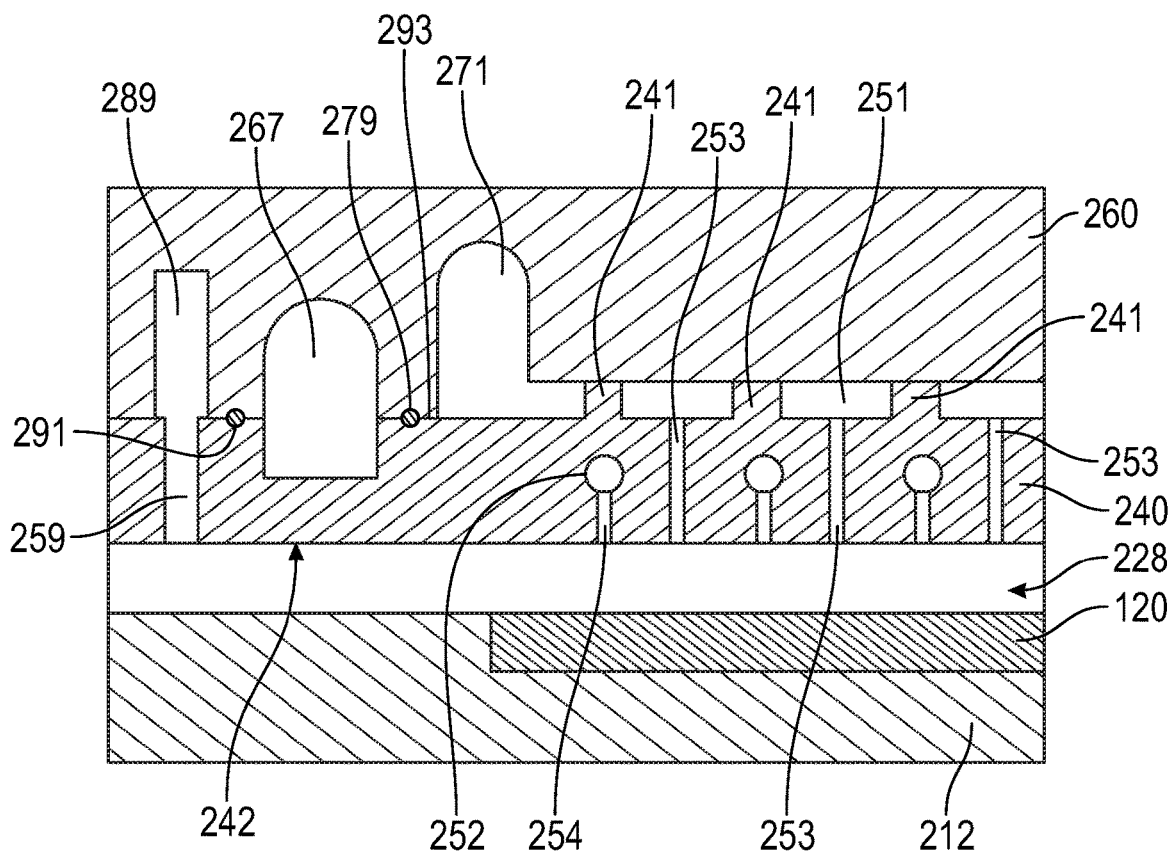
FIG. 10 shows a partial cross-sectional view of a processing chamber in accordance with one or more embodiment of the disclosure.

FIG. 10 illustrates a cross-sectional view of a portion of a processing chamber in accordance with one or more embodiment of the disclosure. A backing plate 260 is positioned adjacent the top surface 241 of the showerhead 240. The backing plate 260 forms a seal with the top surface 241 of the showerhead 240 so that channels 251 are enclosed. The backing plate 260 also encloses plenum 267 and plenum 271. Each of plenum 267 and plenum 271 can have a circularly shaped recess in the backing plate 260. An o-ring 279 can be positioned between the plenum 267 and plenum 271 to maintain separation of the respective gases flowing through the plenums. An exhaust plenum 289 can be located adjacent the holes 259 near the peripheral edge 243 of the showerhead 240. In some embodiments, an o-ring 291 is positioned located between the showerhead 240 and the backing plate 260 to separate the exhaust plenum 289 from the plenum 267.

In use, gases can be flowed through plenum 267 and plenum 271 to pass through showerhead 240 via channel 252 and channel 251, respectively. The gases can be reactive gases or inert gases and can be changed during processing. In some embodiments, the gas flowing through one of the channel 251 and channel 252, and the associated plenum, is a reactive gas and the gas flowing through the other of channel 251 and channel 252, and the associated plenum is an inert gas.

In some embodiments, the gases flowing through both the channel 251 and channel 252 are reactive gases. A configuration of this sort allows for the separation of reactive gases until the reactive species enter the process gap 228 to react with the wafer 120.

According to one or more embodiments, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, annealing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, anneal, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A dual channel showerhead comprising:
   a back surface and a front surface defining a thickness of the showerhead;

a first plurality of channels formed in the back surface of the showerhead, the first plurality of channels extending from a first end to a second end;
a second plurality of channels formed through the thickness of the showerhead, the second plurality of channels extending from a first end to a second end;
a first end plenum formed in the back surface and forming a fluid connection with the second plurality of channels at the first end; and
a second end plenum formed in the back surface and forming a fluid connection with the second plurality of channels at the second end.

2. The dual channel showerhead of claim 1, wherein the first plurality of channels have a square cross-section.

3. The dual channel showerhead of claim 1, wherein the first plurality of channels has a width that increases from the first end to the second end.

4. The dual channel showerhead of claim 1, wherein spacing between each of the plurality of channels is about the same.

5. The dual channel showerhead of claim 1, wherein spacing between each of the first plurality of channels is different at an outer channel than at an inner channel.

6. The dual channel showerhead of claim 1, wherein each of the first plurality of channels comprises a plurality of holes extending to the front surface.

7. The dual channel showerhead of claim 6, wherein a spacing between the plurality of holes is different near the first end than near the second end.

8. The dual channel showerhead of claim 1, wherein the second plurality of channels have a round cross-section.

9. The dual channel showerhead of claim 1, wherein the second plurality of channels has a diameter that increases from the first end to the second end.

10. The dual channel showerhead of claim 1, wherein spacing between each of the second plurality of channels is about the same.

11. The dual channel showerhead of claim 1, wherein spacing between each of the second plurality of channels is different at an outer channel than at an inner channel.

12. The dual channel showerhead of claim 1, wherein each of the second plurality of channels comprises a plurality of holes extending to the front surface.

13. The dual channel showerhead of claim 12, wherein a spacing between the plurality of holes is different near the first end than near the second end.

14. The dual channel showerhead of claim 1, further comprising a plurality of holes through the showerhead, the holes spaced around a periphery of the showerhead.

15. A dual channel showerhead comprising:
a back surface and a front surface defining a thickness of the showerhead;
a first plurality of channels formed in the back surface of the showerhead, the first plurality of channels extending from a first end to a second end, the first plurality of channels having a square cross-section with a cross-sectional area that increases from the first end to the second end, each of the first plurality of channels comprising a plurality of holes extending to the front surface;
a second plurality of channels formed through the thickness of the showerhead, the second plurality of channels extending from a first end to a second end and having a round cross-section with a cross-sectional area that increases from the first end to the second end, each of the second plurality of channels including a plurality of holes extending to the front surface;
a first end plenum formed in the back surface and forming a fluid connection with the second plurality of channels at the first end;
a second end plenum formed in the back surface and forming a fluid connection with the second plurality of channels at the second end; and
a plurality of holes through the showerhead, the holes spaced around a periphery of the showerhead.

16. A processing chamber comprising: a chamber body enclosing an interior;
a pedestal within the interior to support a wafer during processing; an edge ring around the pedestal; a pumping ring around the edge ring, the pumping ring spaced from the edge ring to form a gap; a blocker ring spanning the gap between the edge ring and the pumping ring, the blocker ring isolating a process gap above the pedestal from the interior of the chamber body below the pedestal; and a dual channel showerhead positioned above the pedestal, the showerhead having a front face spaced from the pedestal to form the process gap, wherein the dual channel showerhead comprising: a back surface and a front surface defining a thickness of the showerhead; a first plurality of channels formed in the back surface of the showerhead, the first plurality of channels extending from a first end to a second end, the first plurality of channels having a square cross-section, each of the first plurality of channels comprising a plurality of holes extending to the front surface; a second plurality of channels formed through the thickness of the showerhead, the second plurality of channels extending from a first end to a second end and having a round cross-section, each of the second plurality of channels including a plurality of holes extending to the front surface; a first end plenum formed in the back surface and forming a fluid connection with the second plurality of channels at the first end; a second end plenum formed in the back surface and forming a fluid connection with the second plurality of channels at the second end; and a plurality of holes through the showerhead, the holes spaced around a periphery of the showerhead.

17. The processing chamber of claim 16, wherein the plurality of holes around the periphery of the showerhead are in fluid communication with the process gap.

18. The processing chamber of claim 17, further comprising a backing plate comprising:
a front surface and a back surface, the front surface of the backing plate in contact with the back surface of the showerhead to enclose the first plurality of channels;
first holes and second holes in the back surface;
a first end plenum and a second end plenum formed in the front surface, the first end plenum and second end plenum in fluid communication with the first holes in the back surface of the backing plate, the first end plenum aligned with the first end of the first plurality of channels and the second end plenum aligned with the second end of the first plurality of first channels; and
the second holes in fluid communication with the first end plenum and second end plenum of the showerhead.

19. The processing chamber of claim 18, further comprising:
a lid plate on the backing plate;
an inner insulating ring isolating the showerhead from the pumping ring;
an outer insulating ring isolating the backing plate from the lid plate; and a first precursor inlet in fluid communication with the first holes in the backing plate;

a second precursor inlet in fluid communication with the second holes in the backing plate; and at least one vacuum source in fluid communication with the second end plenum in the showerhead, the second end plenum in the backing plate, the plurality of holes in the periphery of the showerhead and a vacuum plenum in the back surface of backing plate.

\* \* \* \* \*